(12) United States Patent
Chen

(10) Patent No.: US 12,217,815 B2
(45) Date of Patent: Feb. 4, 2025

(54) MEMORY TESTING SYSTEM AND MEMORY TESTING METHOD

(71) Applicant: NANYA TECHNOLOGY CORPORATION, New Taipei (TW)

(72) Inventor: Chien Yu Chen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 171 days.

(21) Appl. No.: 18/055,847

(22) Filed: Nov. 16, 2022

(65) Prior Publication Data

US 2024/0161857 A1    May 16, 2024

(51) Int. Cl.
G11C 29/46    (2006.01)
G11C 29/12    (2006.01)
G11C 29/36    (2006.01)

(52) U.S. Cl.
CPC ........ G11C 29/46 (2013.01); G11C 29/12005 (2013.01); G11C 29/36 (2013.01)

(58) Field of Classification Search
CPC ... G11C 29/46; G11C 29/12005; G11C 29/36; G11C 29/028; G11C 29/021
USPC ................................. 365/200, 201
See application file for complete search history.

(56) References Cited

U.S. PATENT DOCUMENTS

| | | | |
|---|---|---|---|
| 7,130,143 B1* | 10/2006 | Tretter | G11B 5/455 360/67 |
| 9,159,452 B2* | 10/2015 | Yamada | G11C 16/08 |
| 10,732,661 B1* | 8/2020 | Arndt | G05F 3/30 |
| 2010/0291892 A1* | 11/2010 | Moser | G01R 15/09 455/226.2 |
| 2011/0015884 A1* | 1/2011 | Chen | G06F 11/24 702/64 |
| 2013/0058154 A1* | 3/2013 | Katagiri | G11C 29/50008 365/148 |
| 2013/0100734 A1* | 4/2013 | Kuo | G11C 16/28 365/185.2 |
| 2013/0106472 A1* | 5/2013 | Choi | H03K 21/406 327/115 |
| 2016/0050402 A1* | 2/2016 | Jeong | H04N 17/04 348/674 |
| 2016/0141027 A1* | 5/2016 | Yon | G11C 29/12005 365/148 |
| 2018/0080990 A1* | 3/2018 | Seo | G01R 31/382 |
| 2018/0101190 A1* | 4/2018 | Lee | G05F 3/262 |
| 2019/0095308 A1* | 3/2019 | Morris | G11C 29/028 |
| 2019/0392898 A1* | 12/2019 | Haukness | G11C 13/0069 |
| 2020/0020365 A1* | 1/2020 | Takizawa | G11C 13/0061 |
| 2020/0035272 A1* | 1/2020 | Nakaoka | G11C 29/026 |
| 2020/0052616 A1* | 2/2020 | Bosteels | H02P 6/12 |

(Continued)

FOREIGN PATENT DOCUMENTS

TW    200907990 A    2/2009

*Primary Examiner* — Michael T Tran
(74) *Attorney, Agent, or Firm* — CKC & Partners Co., LLC

(57) ABSTRACT

The present disclosure provides a memory testing system, including at least one memory device, a power supply, and a processor. The power supply is configured to provide a first reference voltage to the at least one memory device according to a control signal. The processor is configured to provide the control signal to control the power supply to vary the first reference voltage among multiple voltage levels and test the at least one memory device under the voltage levels to generate multiple first testing results corresponding to the voltage levels.

18 Claims, 9 Drawing Sheets

(56) References Cited

U.S. PATENT DOCUMENTS

| | | | | |
|---|---|---|---|---|
| 2020/0286533 A1* | 9/2020 | Zhang | ................ | G11C 11/1693 |
| 2020/0348740 A1* | 11/2020 | Zhang | .................... | H02M 1/08 |
| 2021/0011080 A1* | 1/2021 | Narwal | ............ | G01R 31/31703 |
| 2021/0134367 A1* | 5/2021 | Lee | ...................... | G11C 29/021 |
| 2021/0233592 A1* | 7/2021 | Nardi | ...................... | G11C 16/26 |
| 2021/0247429 A1* | 8/2021 | Jefferies | ............... | G01R 29/105 |

\* cited by examiner

MEMORY TESTING SYSTEM AND MEMORY TESTING METHOD

BACKGROUND

Field of Invention

The present disclosure relates to a memory technique. More particularly, the present disclosure relates to a memory testing system and a memory testing method.

Description of Related Art

Memory testing usually involves using additional power to ramp up and/or down the voltage(s) received by a memory device and executing different testing programs to test whether the memory is able to function on a system platform. Such tasks cannot be performed by the testing system automatically, and staff needs to be on the site to adjust the voltage or run different programs regularly. Therefore, memory testing requires lots of manpower.

SUMMARY

The present disclosure provides a memory testing system, including at least one memory device, a power supply, and a processor. The power supply is configured to provide a first reference voltage to the at least one memory device according to a control signal. The processor is configured to provide the control signal to control the power supply to vary the first reference voltage among multiple voltage levels and test the at least one memory device under the voltage levels to generate multiple first testing results corresponding to the voltage levels.

The present disclosure also provides a memory testing method, including: providing a first reference voltage to a first memory device; adjusting the first reference voltage from a first voltage level to a second voltage level during multiple time periods; and testing the first memory device during the time periods in response to each of the first voltage level and the second voltage level.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
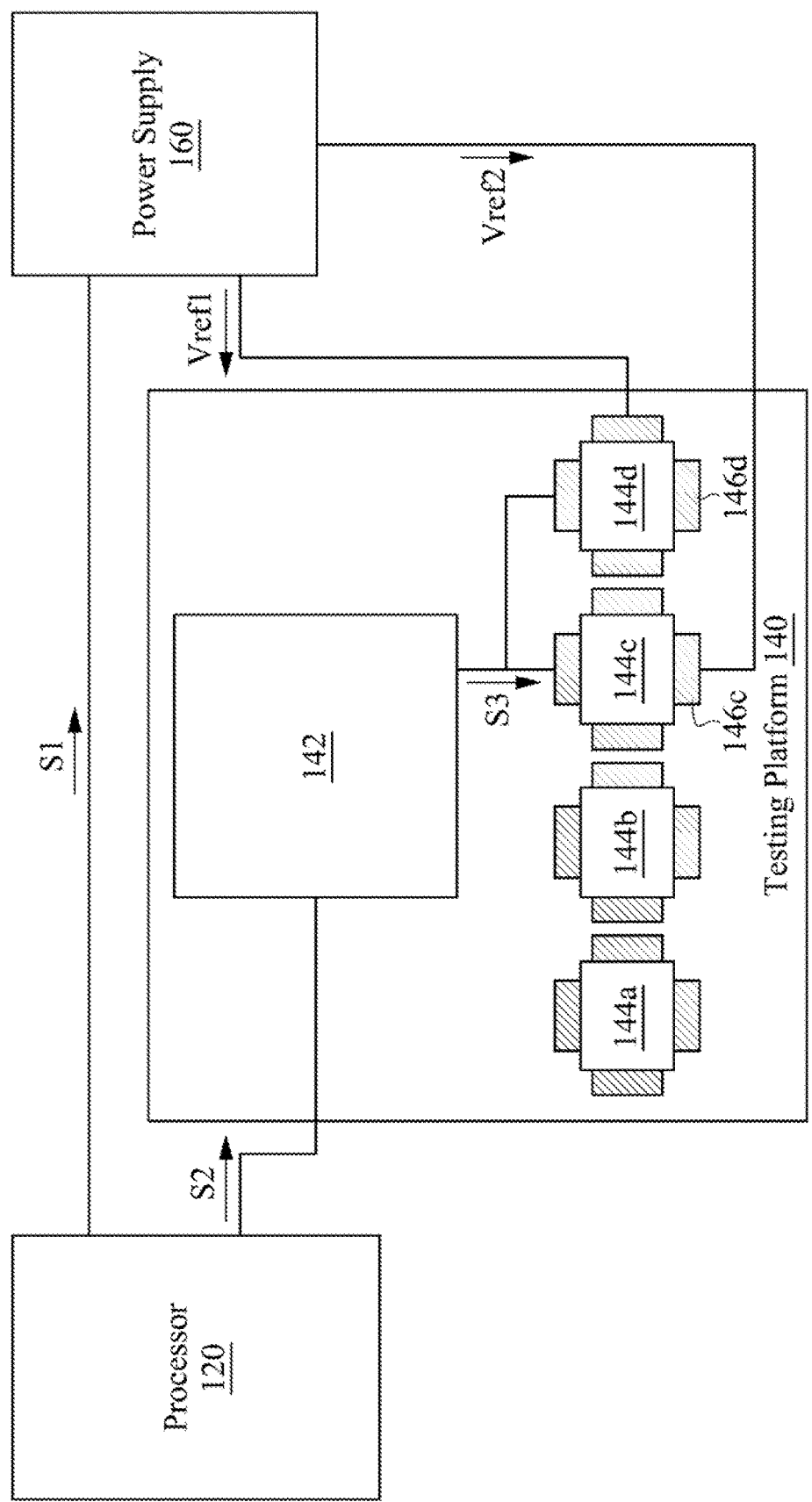
FIG. 1 is a diagram of a memory testing system in accordance with some embodiments of the present disclosure.

Reference will now be made in detail to embodiments of the present disclosure, examples of which are described herein and illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. It is noted that, in accordance with the standard practice in the industry, the drawings are only used for understanding and are not drawn to scale. Hence, the drawings are not meant to limit the actual embodiments of the present disclosure. In fact, the dimensions of the various features may be arbitrarily increased or reduced for clarity of discussion. Wherever possible, the same reference numbers are used in the drawings and the description to refer to the same or like parts for better understanding.

The terms used in this specification generally have their ordinary meanings in the art, within the context of the invention, and in the specific context where each term is used.

As used in the present disclosure, the terms "comprising," "including," "having," "containing," "involving," and the like are to be understood to be open-ended, i.e., to mean including but not limiting to. In addition, as used in the present disclosure, the term "and/or" includes any and all combinations of one or more of the associated listed items. Moreover, it will be understood that, although the terms "first," "second," etc., may be used herein to describe various elements, these elements should not be limited by these terms. These terms are used to distinguish one element from another.

The present disclosure provides a memory testing system. Reference is made to FIG. 1. FIG. 1 is a diagram of a memory testing system 100 in accordance with some embodiments of the present disclosure. The memory testing system 100 includes a processor 120, a testing platform 140, and a power supply 160 that are coupled with each other.

For illustration of FIG. 1, the testing platform 140 includes a processor 142 and multiple memory devices 144a-144d. The processor 142 is coupled to the processor 120 and the memory devices 144c-144d. The memory device 144c is coupled to the power supply 160 through a power card 146c. The memory device 144d is coupled to the power supply 160 through a power card 146d. Relevant details regarding the power cards 146c-146d are discussed and illustrated in later paragraphs and FIG. 2.

In some embodiments, when the testing is complete, the processor 142 is configured to send back a testing result signal to the processor 120, and the testing result signal indicates whether the memory device passes or fails a function test corresponding to the executed testing program.

In some embodiments, when the test is passed, the processor 142 is configured to send back a first testing result signal indicating that the memory device 144d passes the test. When the test is failed, the processor 142 is configured to send back a second testing result signal indicating that the memory device 144d fails the test.

In some embodiments, the memory devices 144a-144d are referred to as the memory devices 144. The power cards 146c-146d are referred to as the power cards 146.

In some embodiments, the testing platform 140 corresponds to a computer, laptop, tablet computer, cell phone, or other electronic device. The memory testing system 100 tests whether the memory devices 144 are able to perform different functions when being used in the testing platform 140.

The number of the memory devices 144 in the testing platform 140 is given for illustrative purposes. Various numbers of the memory devices 144 are within the contemplated scope of the present disclosure. For example, in various embodiments, the testing platform 140 includes only one memory device 144. In various embodiments, the testing platform 140 includes more than four memory devices 144.

In various embodiments, various numbers of memory devices 144 have configurations similar with the configuration of each of the memory devices 144c and 144d. For example, the memory devices 144a-144b are coupled to the processor 142, and are coupled to the power supply 160 through corresponding power cards.

In some embodiments, the memory devices 144a-144d are different from each other. For example, the memory devices 144a-144d are manufactured as the same memory product but have different performance or electric characteristics resulting from the manufacturing process. In another example, the memory devices 144a-144d are manufactured as the different memory products.

For illustration of FIG. 1, the power supply 160 is coupled to the memory devices 144c-144d of the testing platform 140. The power supply 160 is configured to provide a reference voltage Vref1 to the memory device 144d through the power card 146d and to provide a reference voltage Vref2 to the memory device 144c through the power card 146c. The reference voltages Vref1 and Vref2 are configured as working voltages or reference voltages for the memory device 144c-144d respectively.

In some embodiments, the reference voltages Vref1 and Vref2 are referred to as the reference voltages Vref.

In various embodiments, the power supply 160 is coupled to the memory devices 144a-144b and is configured to provide reference voltages to the memory devices 144a-144b through power cards.

In some embodiments, the power supply 160 is a multi power supply and is configured to provide voltages having different voltage levels. Thus, the power supply 160 is able to adjust the reference voltages Vref to different voltage levels.

In some embodiments, by providing and adjusting the reference voltage Vref, the power supply 160 is configured to adjust the working voltage, pumping voltage, and/or reference voltage of the memory device 144 to different voltage levels.

For illustration of FIG. 1, the processor 120 is coupled to the power supply 160 and is configured to provide a control signal S1 to the power supply 160 to control the power supply 160 to vary the voltage levels of the reference voltages Vref1 and Vref2. The processor 120 is also coupled to the processor 142 of the testing platform 140.

For illustration of FIG. 1, in order to test the memory device 144d, the processor 120 is configured to provide the control signal S1 to control the power supply 160 to vary the reference voltage Vref1 among multiple voltage levels. The voltage levels include, for example, voltage levels VL1-VL11 as shown in FIGS. 4A-5B.

In some embodiments, when the testing for the memory device 144d is complete, the processor 120 is configured to control the power supply 160 to change the voltage level of the reference voltage Vref1, and then tests the memory device 144d again. Thus, the processor 120 can test the memory device 144d under different voltage levels by executing the same testing program.

In some embodiments, the memory testing system 100 further includes a non-transitory computer readable medium (not shown in FIG. 1) that is coupled to the processor 120. The non-transitory computer readable medium is configured to store multiple testing programs. The processor 120 is configured to access the non-transitory computer readable medium and execute the testing programs to test the memory devices 144. Specifically, when the processor 120 executes a testing program, it gives corresponding commands to the processor 142 by sending a signal S2 to the processor 142. After receiving the signal S2, the processor 142 then performs operations corresponding to the signal S2 to the memory device(s) 144. For example, the processor 142 generates a testing signal S3 based on the signal S2, and applies the testing signal S3 to the memory device(s) 144.

In some embodiments, when the power supply 160 provides the reference voltage Vref to the memory device 144d according to the control signal S1, the processor 120 is configured to test the memory device 144d under the voltage levels VL1-VL11 to generate multiple testing results corresponding to the voltage levels VL1-VL11. Specifically, the processor 120 executes one of the testing programs and gives corresponding commands to the processor 142 through the signal S2. After receiving the signal S2, the processor 142 performs corresponding operations to the memory device 144d, in order to test whether the memory device 144 is able to perform the operations without malfunction or crash.

For illustration of FIG. 1, in some embodiments, the memory testing system 100 is able to test the memory devices 144c-144d at the same time. The power supply 160 is configured to provide the reference voltage Vref1 to the memory device 144d through the power card 146d and provide the reference voltage Vref2 to the memory device 144c through the power card 146c. The processor 120 is configured to control the power supply 160 to vary the reference voltages Vref1 and Vref2 among the voltage levels VL1-VL11.

The processor 120 is configured to execute a testing program to test the memory device 144d to generate a testing result corresponding to the reference voltage Vref1, and execute the testing program to test the memory device 144c to generate a testing result corresponding to the second reference voltage Vref2. Alternatively stated, a same testing program is used to test the memory devices 144c-144d. Specifically, the processor 120 executes a testing program and sends the signal S2 to the processor 142, and the processor 142 sends the testing signal S3 to the memory devices 144c-144d, to test the memory device 144c receiving the reference voltage Vref2 and test the memory device 144d receiving the reference voltage Vref1.

In some embodiments, when the testing for the memory devices 144c-144d is complete, the processor 120 is configured to control the power supply 160 to step up or down the reference voltage Vref1 and/or the reference voltage Vref2, and execute the testing program again, to generate testing results corresponding to different voltage levels.

In some embodiments, the testing programs mentioned above are configured to test different functions of the memory devices 144. The functions include, for example, playing three-dimension video for a long time period, keeping the testing platform 140 in standby mode for a long time period, restarting the testing platform 140 consecutively for numerous times, and performing complex read and/or write operations to the memory devices 144.

Paragraphs below discuss details regarding the memory devices 144 and the power cards 146 through FIGS. 2-3. Some embodiments of testing process for the memory devices 144 will be discussed in paragraphs that follow.

Figure 2:
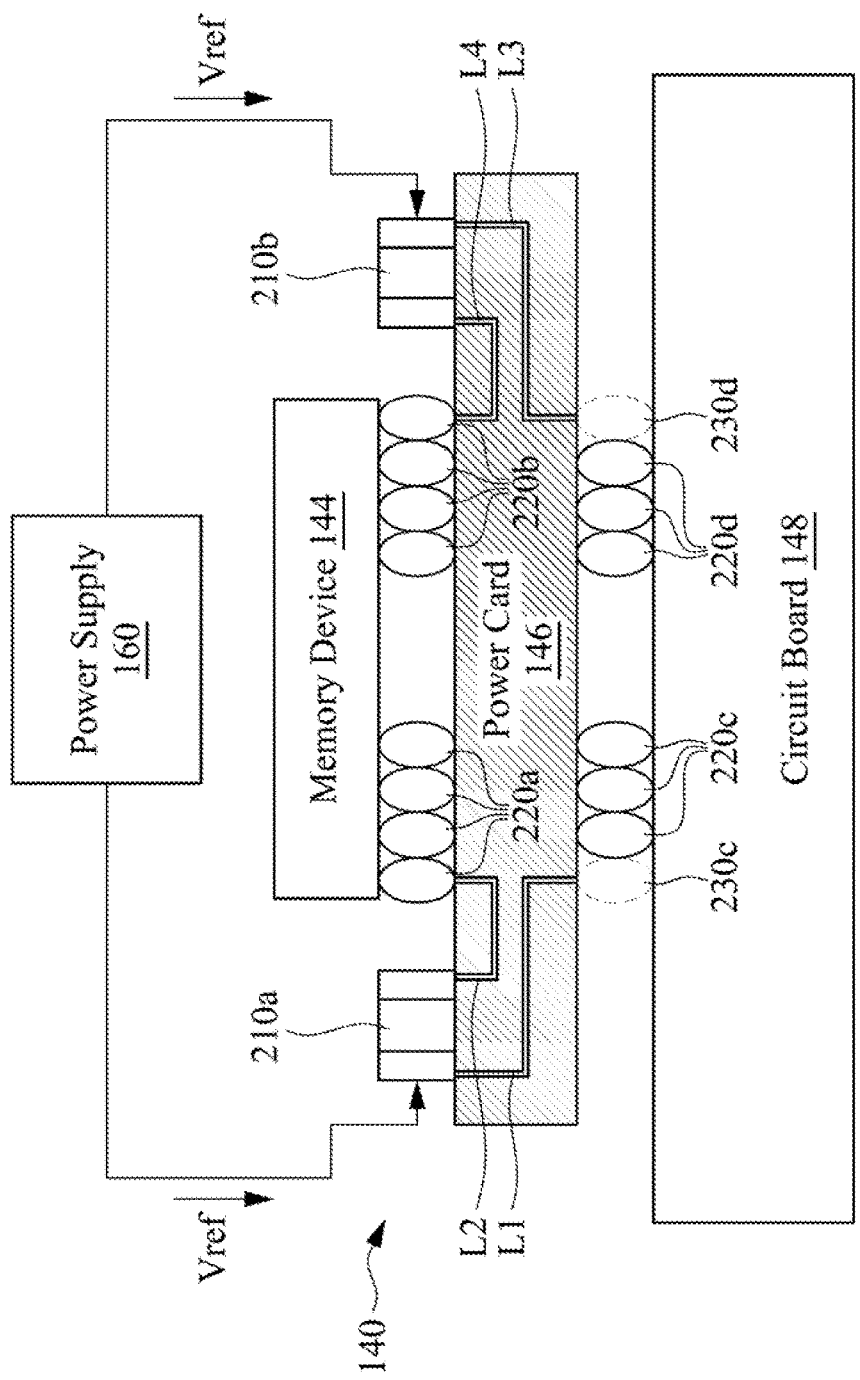
FIG. 2 is a diagram of a portion of the memory testing system as shown in FIG. 1 in accordance with some embodiments of the present disclosure.

Reference is made to FIG. 2. FIG. 2 is a diagram of a portion of the memory testing system 100 as shown in FIG. 1 in accordance with some embodiments of the present disclosure. As illustratively shown in FIG. 2, the testing platform 140 further includes a circuit board 148, conductive components 220a-220d, and pads 210a, 210b. The power card 146 is coupled to the memory device 144 through multiple conductive components 220a-220b and is coupled to the circuit board 148 through multiple conductive components 220c-220d. Alternatively stated, the power card 146 is arranged and coupled between the memory device 144 and the circuit board 148.

In some embodiments, the circuit board 148 is further coupled to a processor and is configured to transmit signals between the processor and the memory device 144. For example, the circuit board 148 is coupled to the processor 142 shown in FIG. 1 and is configured to transmit the signal S3 from the processor 142 to the memory device 144.

In some embodiments, the conductive components 220a-220d are made of metal. In some embodiments, the conductive components 220a-220d are solder balls.

For illustration of FIG. 2, two pads 210a-210b are arranged on the power card 146. The pad 210a is coupled to the power supply 160 and electric lines L1-L2 and is configured to receive a voltage and transmit the voltage to the memory device 144 through the electric line L2 and the conductive components 220a. The pad 210b is coupled to the power supply 160 and electric lines L3-L4 and is configured to receive a voltage and transmit the voltage to the memory device 144 through the electric line L4 and the conductive components 220b.

In some examples, two extra conductive components are arranged at spaces 230c-230d respectively. The conductive component arranged at the space 230c is configured to receive a voltage from the circuit board 148 and transmit such voltage to the pad 210a through the electric line L1, and then the pad 210a is configured to transmit the voltage to the memory device 144 through the electric line L2 and the conductive components 220a. Similarly, the conductive component arranged at the space 230d is configured to receive a voltage from the circuit board 148 and transmit such voltage to the pad 210b through the electric line L3, and then the pad 210b is configured to transmit the voltage to the memory device 144 through the electric line L4 and the conductive components 220b. Alternatively stated, in these examples, the circuit board 148 is configured to provide voltage(s) to the memory device 144 through the power card 146. In some embodiments, the voltage(s) provided by the circuit board 148 is fixed.

For illustration of FIG. 2, different from the examples discussed above, there is no conductive component arranged at the spaces 230c-230d, and the pads 210a-210b receive the reference voltage Vref from the power supply 160. The pad 210a transmits the reference voltage Vref to the memory device 144 through the electric line L2 and the conductive components 220a, and the pad 210b transmits the reference voltage Vref to the memory device 144 through the electric line L4 and the conductive components 220b.

In some embodiments, the power supply 160 is configured to adjust the voltage level of the reference voltage Vref. Therefore, the memory testing system 100 is able to test whether the memory device 144 can operate under different voltage levels by adjusting the voltage level of the reference voltage Vref. For example, the memory testing system 100 can test whether the memory device 144 will malfunction and cause the testing platform 140 to crash when receiving the reference voltage Vref that is much higher or lower than the voltage that the circuit board 148 generally provides.

In some embodiments, the power card 146 is a signal integer (SI) card and includes extra pads other than the pads 210a-210b. These extra pads are configured to detect or monitor signals of the power card 146 and transmit these signals to other device.

Figure 3:
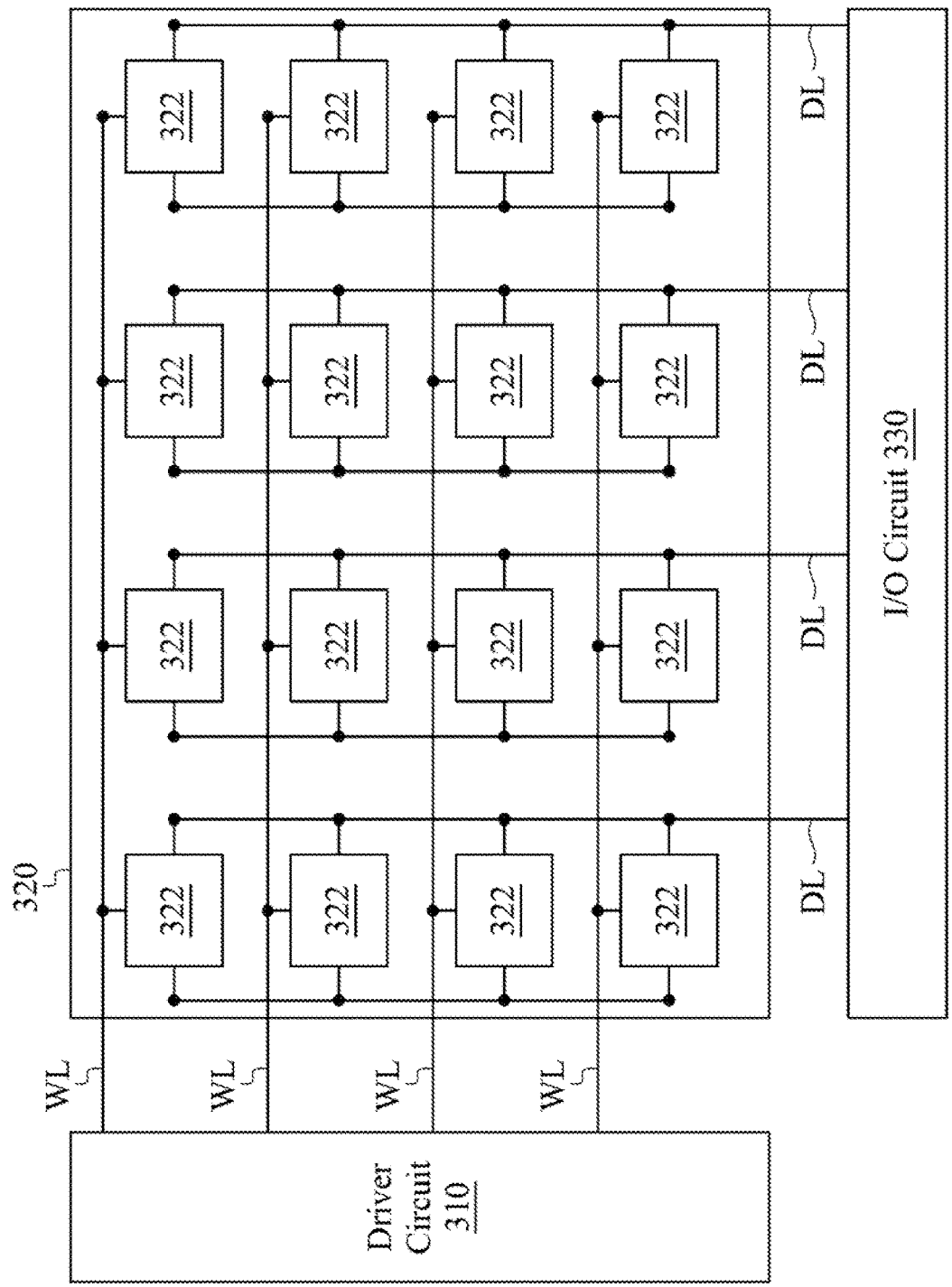
FIG. 3 is a diagram of the memory device as shown in FIG. 1 in accordance with some embodiments of the present disclosure.

Reference is made to FIG. 3. FIG. 3 is a diagram of the memory device 144 as shown in FIG. 1 in accordance with some embodiments of the present disclosure. The memory device 144 includes a driver circuit 310, a memory array 320, and an input/output (I/O) circuit 330. The memory array 320 includes multiple memory cells 322 arranged in columns and rows. The driver circuit 310 is coupled to the memory cells 322 through word lines WL. The I/O circuit 330 is coupled to the memory cells 322 through data lines DL.

For illustration of FIGS. 1-3, the reference voltage Vref provided by the power supply 160 is transmitted to the memory device 144. In some embodiments, the reference voltage Vref is further transmitted to the driver circuit 310 of the memory device 144 and is configured as a working voltage for the driver circuit 310 to perform read and/or write operations to the memory cells 322.

In some embodiments, the reference voltage Vref is further transmitted to the memory array 320 of the memory device 144 and is configured as a reference voltage for the memory array 320. The reference voltage Vref is referred to as a pumping voltage for the memory array 320.

In some embodiments, the reference voltage Vref is further transmitted to the I/O circuit 330 of the memory device 144 and is configured as a reference voltage for the I/O circuit 330.

Figure 4A:
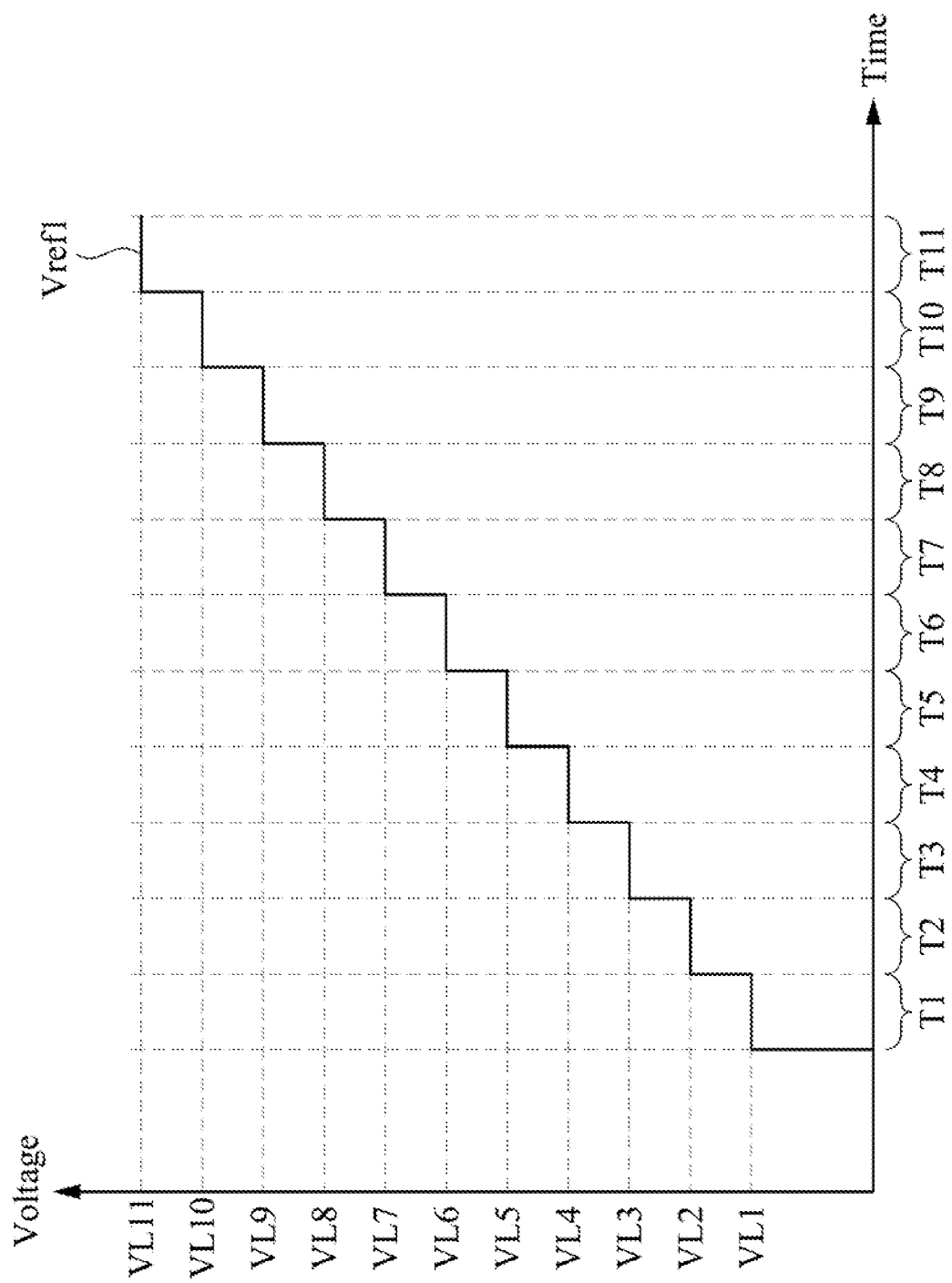
FIG. 4A is a diagram illustrating a voltage-time relationship for a first reference voltage as shown in FIG. 1 in accordance with some embodiments of the present disclosure.
Figure 4B:
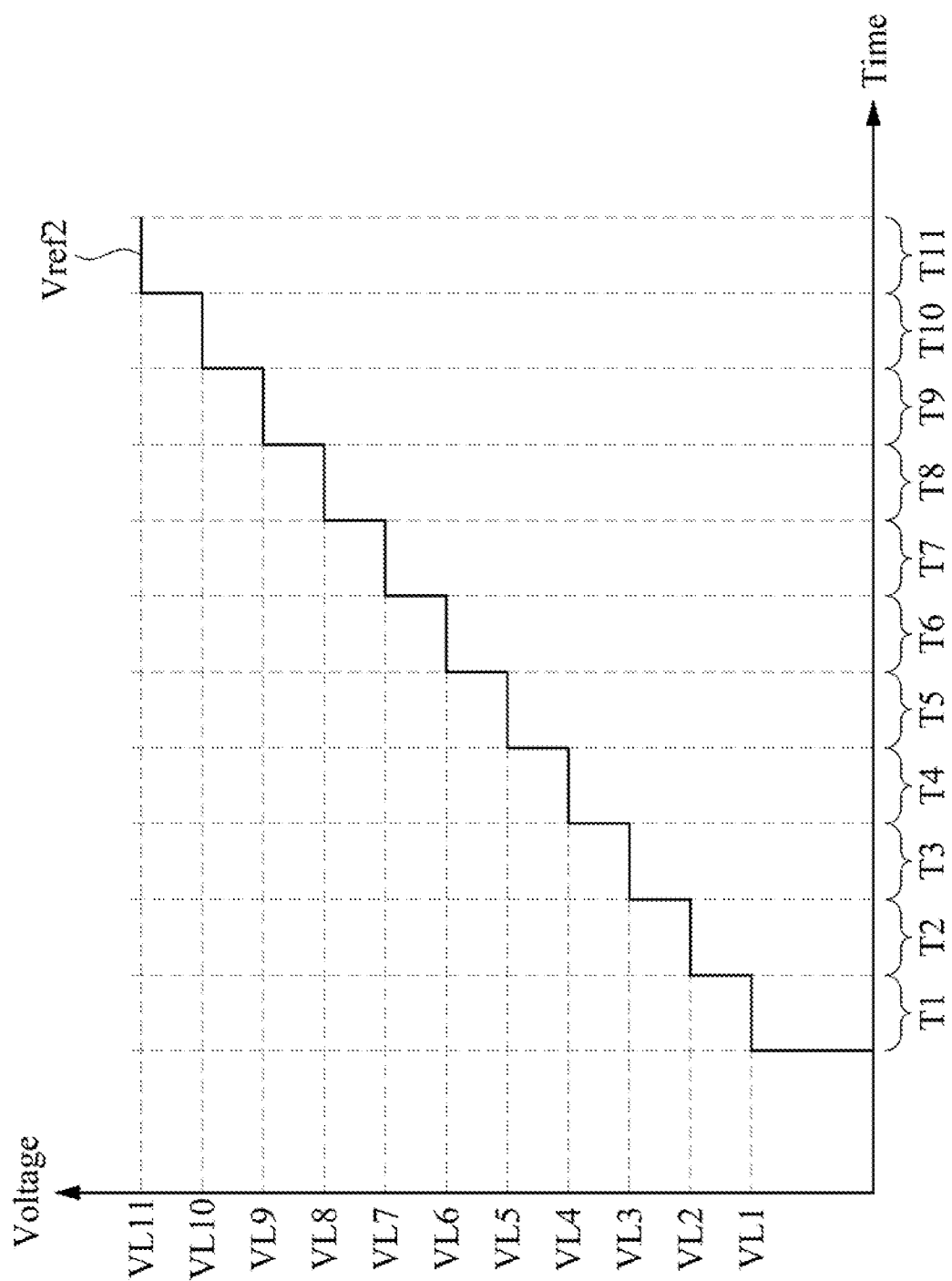
FIG. 4B is a diagram illustrating a voltage-time relationship for a second reference voltage as shown in FIG. 1 in accordance with some embodiments of the present disclosure.

Reference is made to FIGS. 4A-4B. FIG. 4A is a diagram illustrating a voltage-time relationship for the first reference voltage Vref1 as shown in FIG. 1 in accordance with some embodiments of the present disclosure. FIG. 4B is a diagram illustrating a voltage-time relationship for the second reference voltage Vref2 as shown in FIG. 1 in accordance with some embodiments of the present disclosure. Horizontal axes of the FIGS. 4A-4B correspond to time, and vertical axes of the FIGS. 4A-4B correspond to voltage. In some embodiments, the processor 120 is configured to control the power supply 160 to step up the reference voltages Vref1 and Vref2 in a consecutive manner.

For illustration of FIG. 4A, periods T1-T11 are arranged continuously in order along the time axis. The reference voltage Vref1 has voltage levels VL1-VL11 during the periods T1-T11, respectively. The voltage levels VL1-VL11 are arranged in order along the voltage axis. In some embodiments, the minimum voltage level VL1 and the maximum voltage level VL11 constitute a voltage range that is used to test memory devices 144. In some embodiments, the voltage range is predetermined by the processor 120.

In some embodiments, a difference between two adjacent voltage levels of the voltage levels VL1-VL11 is equal to a difference between another two adjacent voltage levels of the voltage levels VL1-VL11. For example, a difference between the voltage levels VL1 and VL2 is substantially equal to a difference between the voltage levels VL3 and VL4. In some embodiments, the difference between any two adjacent voltage levels of the voltage levels VL1-VL11 is referred to as a voltage step, and the voltage step is the same for any two adjacent voltage levels of the voltage levels VL1-VL11. For example, the voltage step is 0.01V, 0.1V, 0.5V or other value.

Figure 5A:
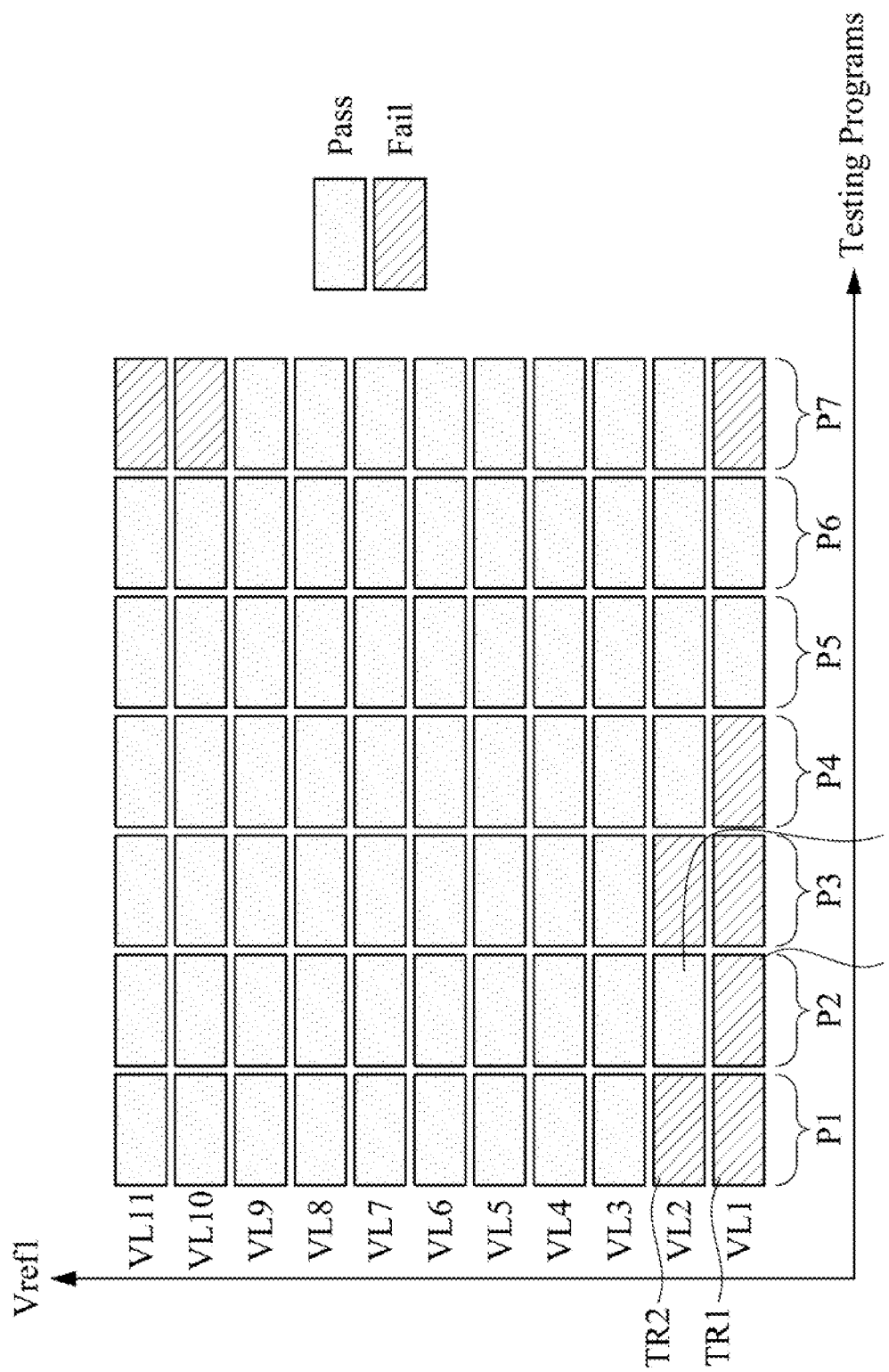
FIG. 5A is a diagram illustrating testing results for a first memory device as shown in FIG. 1 in accordance with some embodiments of the present disclosure.

For illustration of FIGS. 1 and 4A, during the period T1, the reference voltage Vref1 has the voltage level VL1, and the memory device 144d is tested under the voltage level VL1 to generate a testing result, such as the testing result TR1 shown in FIG. 5A, to the processor 142. After the testing is complete, the processor 142 sends back the testing result TR1 to the processor 120. Then, at a moment between the periods T1 and T2, the reference voltage Vref1 is stepped up from the voltage level VL1 to the voltage level VL2. During the period T2, the memory device 144d is tested under the voltage level VL2 to generate a testing result, such as the testing result TR2 shown in FIG. 5A, to the processor 142. Similarly, the reference voltage Vref1 is stepped up to the voltage levels VL3-VL11 in order during corresponding periods, and the memory device 144d is tested under the voltage levels VL3-VL11 to generate corresponding testing results.

For illustration of FIG. 4B, the reference voltage Vref2 also has voltage levels VL1-VL11 during the periods T1-T11, respectively. For illustration of FIGS. 4A and 4B, the reference voltage Vref1 is substantially equal to the second reference voltage Vref2. Alternatively stated, the reference voltages Vref1 and Vref2 have the same voltage-time relationship as shown in FIGS. 4A-4B. Therefore, some descriptions are not repeated for brevity.

Figure 4C:
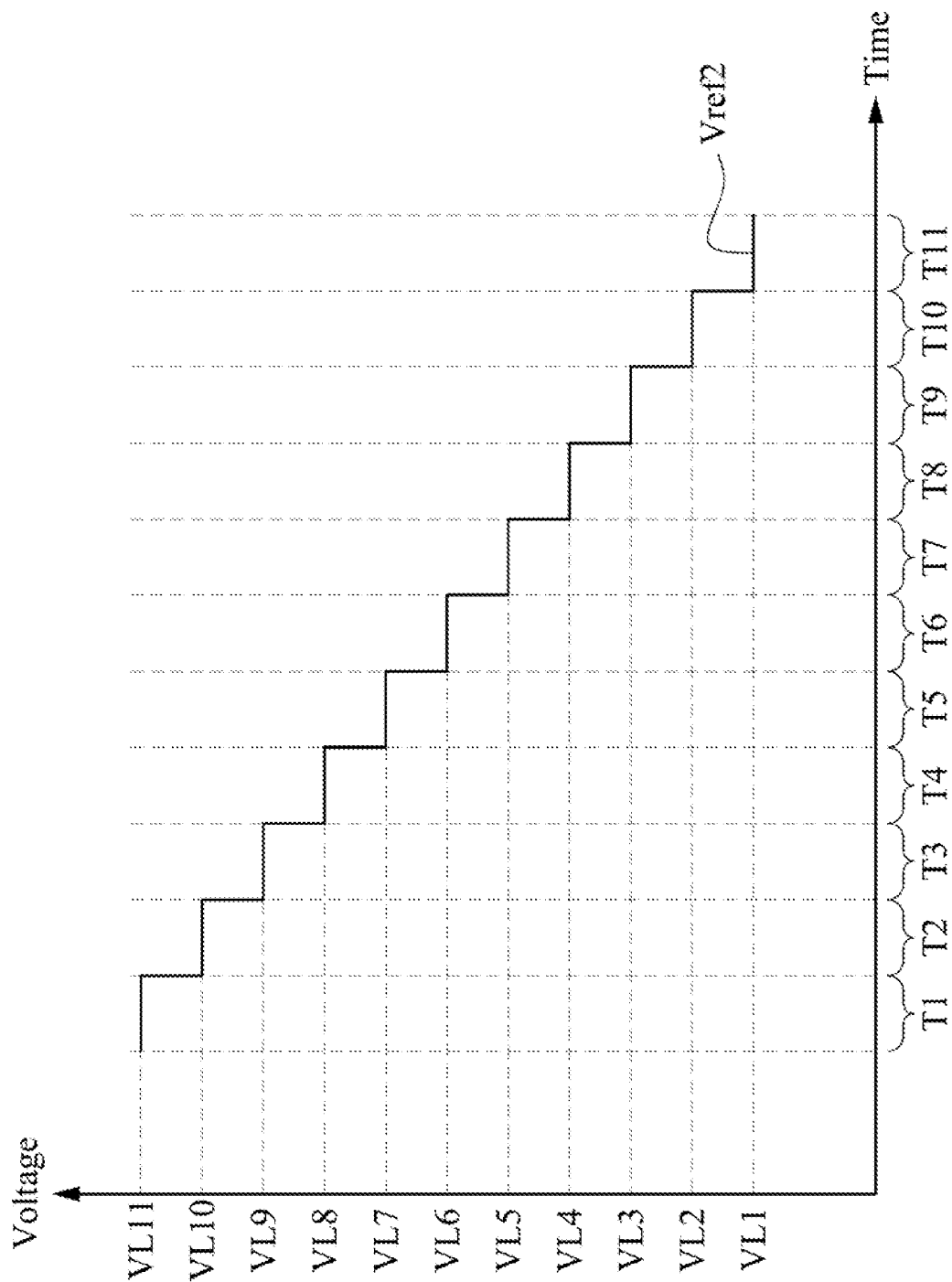
FIG. 4C is a diagram illustrating a voltage-time relationship for the second reference voltage as shown in FIG. 1 in accordance with various embodiments of the present disclosure.

Reference is made to FIG. 4C. FIG. 4C is a diagram illustrating a voltage-time relationship for the reference voltage Vref2 as shown in FIG. 1 in accordance with various embodiments of the present disclosure. In some embodiments, the processor 120 is configured to control the power supply 160 to step down the reference voltage Vref2 in a consecutive manner, and the reference voltage Vref2 has the voltage-time relationship as shown in FIG. 4C, which is different from the relationship shown in FIG. 4B.

For illustration of FIG. 4C, the reference voltage Vref2 also has voltage levels VL11-VL1 during the periods T1-T11, respectively. For illustration of FIGS. 4A and 4C, in some embodiments, from the period T1 to the period T11, the reference voltage Vref1 varies from the voltage level VL1 to the voltage level VL11, and the reference voltage Vref2 varies from the voltage level VL11 to the voltage level VL1. In some embodiments, the reference voltages Vref1 and Vref2 have the same voltage level at one of the periods T1-T11 and have different voltage levels at other ones of the periods T1-T11. For example, each of the reference voltages Vref1 and Vref2 has the voltage level VL6 during the period T6. On the other hand, the reference voltage Vref2 has the voltage levels VL5 and VL7 during the periods T7 and T5, respectively, and the reference voltage Vref1 has the voltage levels VL7 and VL5 during the periods T7 and T5, respectively.

In some embodiments, the voltage levels VL1-VL11 are 1.00V, 1.05V, 1.10V, 1.15V, 1.20V, 1.25V, 1.30V, 1.35V, 1.40V, 1.45V, and 1.50V, respectively. The voltages of the voltage levels VL1-VL11 are given for illustrative purposes. Various voltages of the voltage levels VL1-VL11 are within the contemplated scope of the present disclosure.

In some embodiments, each of time periods T1-T11 shown in FIGS. 4A-4C has the same length. The length is determined by the processor 120 according to the testing program that is executed. For example, in some embodiments, a testing program tests whether the memory device 144 can play three-dimension video for 6 hours, the length of each time period is 6 hours. In another example, a testing program tests whether the memory device 144 can maintain the testing platform 140 to be in standby mode for 12 hours, the length of each time period is 12 hours.

Reference is made to FIG. 5A. FIG. 5A is a diagram illustrating testing results for the first memory device 144d as shown in FIG. 1 in accordance with some embodiments of the present disclosure. A horizontal axis of FIG. 5A corresponds to multiple testing programs P1-P7, and a vertical axis of FIG. 5A corresponds to voltage levels of the reference voltage Vref1.

For illustration of FIGS. 1, 4A, and 5A, in some embodiments, the processor 120 tests the memory device 144d by executing the testing programs P1-P7 continually. First, the processor 120 is configured to execute the testing program P1 and control the power supply 160 to vary the reference voltage Vref1 from the voltage level VL1 to the voltage level VL11, to generate testing results corresponding to the testing program P1. Specifically, during the period T1, the processor 120 is configured to execute the testing program P1 and control the power supply 160 to adjust the reference voltage Vref1 to the voltage level VL1, to generate a testing result TR1 corresponding to the voltage level VL1 and the testing program P1. During the period T2, the processor 120 is configured to execute the testing program P1 and control the power supply 160 to adjust the reference voltage Vref1 to the voltage level VL2, to generate a testing result TR2 corresponding to the voltage level VL2 and the testing program P1. Similarly, the processor 120 is configured to execute the testing program P1 and control the power supply 160 to adjust the reference voltage Vref1 to voltage levels VL3-VL11 to generate multiple testing results corresponding to the testing program P1. The testing results corresponding to the testing program P1 are arranged in the column corresponding to the testing program P1 as shown in FIG. 5A.

Then, the processor 120 is configured to execute a testing program P2 and control the power supply 160 to vary the reference voltage Vref1 from the voltage level VL1 to the voltage level VL11 to generate testing results corresponding to the testing program P2. Specifically, during the period T1, the processor 120 is configured to execute the testing program P2 and control the power supply 160 to adjust the reference voltage Vref1 to the voltage level VL1, to generate a testing result TR3 corresponding to the voltage level VL1 and the testing program P2. During the period T2, the processor 120 is configured to execute the testing program P2 and control the power supply 160 to adjust the reference voltage Vref1 to the voltage level VL2, to generate a testing result TR4 corresponding to the voltage level VL2 and the testing program P2. Similarly, the processor 120 is configured to execute the testing program P2 and control the power supply 160 to adjust the reference voltage Vref1 to voltage levels VL3-VL11 to generate multiple testing results corresponding to the testing program P2. The testing results corresponding to the testing program P2 are generated and are arranged in the column corresponding to the testing program P2 as shown in FIG. 5A. Accordingly, by executing different testing programs and adjusting the reference voltage Vref1, testing results corresponding to different testing programs are generated and integrated in FIG. 5A.

In various embodiments, the processor 120 is configured to execute the testing program P1 and control the power supply 160 to vary the reference voltage Vref1 from the voltage level VL11 to the voltage level VL1 to generate testing results corresponding to the testing program P1. Then, the processor 120 is configured to execute the testing program P2 and control the power supply 160 to vary the reference voltage Vref1 from the voltage level VL11 to the voltage level VL1 to generate testing results corresponding to the testing program P2.

In some embodiments, the testing programs P1-P7 are different and test different functions of the memory device 144.

For illustration of FIG. 5A, each of the testing results is either "Pass" or "Fail". "Pass" and "Fail" are denoted as different dots respectively as shown in FIG. 5A.

In some embodiments, FIG. 5A shows whether the memory device 144d can perform testing programs P1-P7 under different voltage levels. For example, as shown in FIG. 5A, the memory device 144d cannot perform testing programs P1-P4 and P7 under the voltage level VL1, as the "Fail" testing results indicate. Thus, manufacturers or designers of the memory device 144d can refine or redesign the memory device 144d according to the testing results shown in FIG. 5A.

Figure 5B:
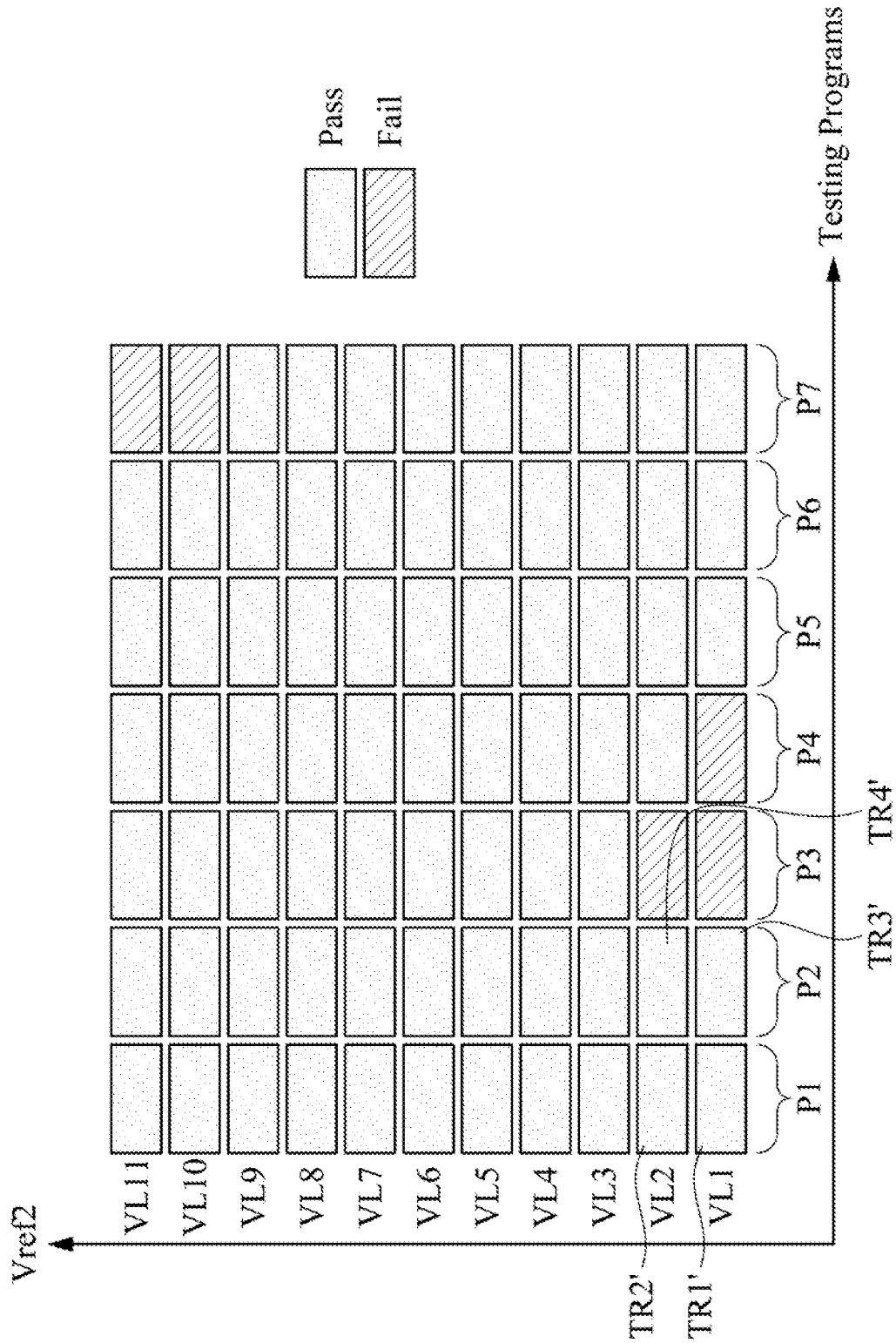
FIG. 5B is a diagram illustrating testing results for a second memory device as shown in FIG. 1 in accordance with some embodiments of the present disclosure.

In some embodiments, FIGS. 5A-5B are referred to as shmoo plots.

For illustration of FIGS. 1 and 5A, the processor 120 executes the testing program P1 and controls the reference voltage Vref1 to vary among the voltage levels VL1-VL11, and the testing results arranged in the column corresponding to the testing program P1 are generated. Then, the processor 120 executes the testing program P2 and varies the voltage level of the reference voltage Vref1 similarly, and the testing results arranged in the column corresponding to the testing program P2 are generated. Thus, testing results arranged in different columns can correspond to the same voltage level, as shown in FIG. 5A. For example, the bottom one of the testing results arranged in the column corresponding to the testing program P1 and the bottom one of the testing results arranged in the column corresponding to the testing program P2 both correspond to the voltage level VL1.

Reference is made to FIG. 5B. FIG. 5B is a diagram illustrating testing results for the second memory device 144c as shown in FIG. 1 in accordance with some embodiments of the present disclosure. A horizontal axis of FIG. 5B corresponds to multiple testing programs P1-P7, and a vertical axis of FIG. 5B corresponds to voltage levels of the reference voltage Vref2.

For illustration of FIGS. 1, 4B, and 5B, in some embodiments, the processor 120 tests the memory device 144c by executing the testing programs P1-P7 continually. First, the processor 120 is configured to execute the testing program P1 and control the power supply 160 to vary the reference voltage Vref2 from the voltage level VL1 to the voltage level VL11, to generate testing results corresponding to the testing program P1. Specifically, during the period T1, the processor 120 is configured to execute the testing program P1 and control the power supply 160 to adjust the reference voltage Vref2 to the voltage level VL1, to generate a testing result TR1' corresponding to the voltage level VL1 and the testing program P1. During the period T2, the processor 120 is configured to execute the testing program P1 and control the power supply 160 to adjust the reference voltage Vref2 to the voltage level VL2, to generate a testing result TR2' corresponding to the voltage level VL2 and the testing program P1. Similarly, the processor 120 is configured to execute the testing program P1 and control the power supply 160 to adjust the reference voltage Vref2 to voltage levels VL3-VL11 to generate multiple testing results corresponding to the testing program P1. The testing results corresponding to the testing program P1 are arranged in the column corresponding to the testing program P1 as shown in FIG. 5B.

Then, the processor 120 is configured to execute a testing program P2 and control the power supply 160 to vary the reference voltage Vref2 from the voltage level VL1 to the voltage level VL11 to generate testing results corresponding to the testing program P2. Specifically, during the period T1, the processor 120 is configured to execute the testing program P2 and control the power supply 160 to adjust the reference voltage Vref2 to the voltage level VL1, to generate a testing result TR3' corresponding to the voltage level VL1 and the testing program P2. During the period T2, the processor 120 is configured to execute the testing program P2 and control the power supply 160 to adjust the reference voltage Vref2 to the voltage level VL2, to generate a testing result TR4' corresponding to the voltage level VL2 and the testing program P2. Similarly, the processor 120 is configured to execute the testing program P2 and control the power supply 160 to adjust the reference voltage Vref2 to voltage levels VL3-VL11 to generate multiple testing results corresponding to the testing program P2. The testing results corresponding to the testing program P2 are generated and are arranged in the column corresponding to the testing program P2 as shown in FIG. 5B. Accordingly, by executing different testing programs and adjusting the reference voltage Vref2, testing results corresponding to different testing programs are generated and integrated in FIG. 5B.

In various embodiments, for illustration of FIG. 4C, the processor 120 is configured to execute the testing program P1 and control the power supply 160 to vary the reference voltage Vref2 from the voltage level VL11 to the voltage level VL1 to generate testing results corresponding to the testing program P1. Then, the processor 120 is configured to execute the testing program P2 and control the power supply 160 to vary the reference voltage Vref2 from the voltage level VL11 to the voltage level VL1 to generate testing results corresponding to the testing program P2.

As discussed in previous embodiments, the memory testing system 100 is able to test the memory devices 144c-144d at the same time. For illustration of FIGS. 1, 4B, and 5B, the processor 120 uses the testing programs P1-P7 to test the memory device 144c, and testing results are generated as shown in FIG. 5B.

In some embodiments, the processor 120 executes the same testing program to test both the memory devices 144c-144d while varying the reference voltages Vref1 and Vref2 among the voltage levels VL1-VL11. After testing the memory devices 144c-144d by the testing program P1, testing results correspond to the testing program P1 as shown in FIGS. 5A-5B are generated, and the processor 120 executes another one of the testing programs P1-P7 to test both the memory devices 144c-144d.

In some embodiments, the memory testing system 100 executes the same testing program to test the memory devices 144c-144d at the same time, and the processor 120 generates corresponding testing results during the same period. For example, for illustration of FIGS. 5A and 5B, the memory testing system 100 executes the testing program P1 to test the memory devices 144c-144d at the same time, and the testing result TR1 and TR1' are generated simultaneously during the period T1. Similarly, the testing result TR2 and TR2' are generated simultaneously during the period T2.

Figure 6:
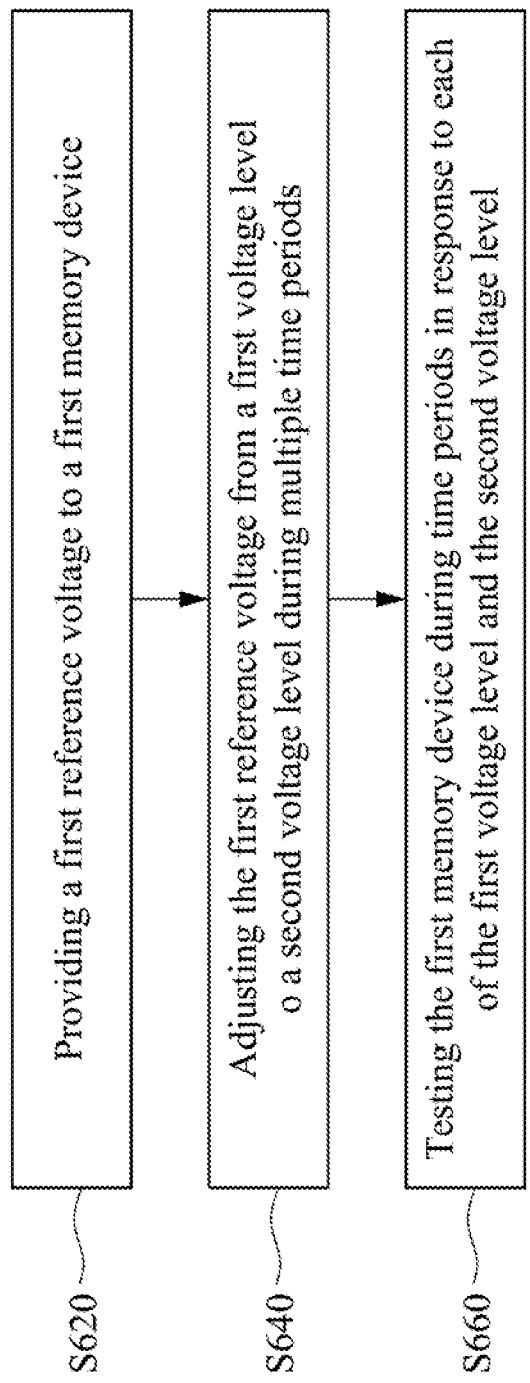
FIG. 6 is a flowchart of a memory testing method in accordance with some embodiments of the present disclosure.

Reference is made to FIG. 6. FIG. 6 is a flowchart of a memory testing method 600 in accordance with some embodiments of the present disclosure. The memory testing method 600 includes steps S620, S640, and S660. The memory testing method 600 and its steps can be performed by the memory testing system 100 discussed above. Relevant details in previous embodiments can be referred to in understanding the implementation of the memory testing method 600.

For illustration of FIGS. 1 and 6, at step S620, the power supply 160 provides the reference voltage Vref1 to the memory device 144d.

For illustration of FIGS. 1, 4A, and 6, at step S640, the processor 120 controls the power supply 160 to adjust the reference voltage Vref1 from the voltage level VL1 to the voltage level VL11 during periods T1-T11.

In some embodiments, adjusting the reference voltage Vref1 from the voltage level VL1 to the voltage level VL11 during periods T1-T11 further includes adjusting the reference voltage Vref1 to the voltage level VL1 at the moment between the period T1 and the period T2 and adjusting the reference voltage Vref1 to the voltage level VL11 at the moment between the period T10 and the period T11.

In various embodiments, the processor 120 controls the power supply 160 to adjust the reference voltage Vref1 from the voltage level VL11 to the voltage level VL1 during periods T1-T11.

In some embodiments, adjusting the reference voltage Vref1 includes: the power supply 160 adjusting the reference voltage Vref1 to a voltage level between the voltage level VL1 and the voltage level VL11 to test the memory device 144d for such voltage level. For example, the power supply 160 adjusts the reference voltage Vref1 to one of the voltage levels VL2-VL10, in order to test the memory device 144d for such voltage level.

For illustration of FIGS. 1 and 6, at step S660, the processor 120 tests the memory device 144d during periods T1-T11 in response to each of the voltage level VL1 and the second voltage level VL11.

In some embodiments, the processor 120 tests the memory device 144d in response to the voltage level VL1 and generates a testing result corresponding to the voltage level VL1. The processor 120 tests the memory device 144d in response to the voltage level VL11 and generates another testing result corresponding to the voltage level VL11.

In some embodiments, the memory testing method 600 further includes: the power supply 160 providing the reference voltage Vref2 to the memory device 144c different from the memory device 144d; the processor 120 controlling the power supply 160 to adjust the reference voltage Vref2 from the voltage level VL1 to the voltage level VL11, or from the voltage level VL11 to the voltage level VL1, during the periods T1-T11; and the processor 120 applying the testing signal S3 to test the memory devices 144c-144d during the periods T1-T11 in response to the reference voltage Vref2. Thus, the memory devices 144c-144d are tested at the same time.

Following the embodiments above, in some embodiments, the memory testing method 600 further includes: the processor 120 generating first testing results corresponding to the memory device 144d in response to the testing signal S3 during the periods T1-T11; and the processor 120 generating second testing results corresponding to the memory device 144c in response to the testing signal S3 during the periods T1-T11. A number of the first testing results, a number of the second testing results and the time periods T1-T11 are the same. Alternatively stated, the processor 120 generates the first testing results corresponding to the memory device 144d and the second testing results corresponding to the memory device 144c. During each of the time periods T1-T11, one of the first testing results and one of the second testing results are generated.

In some embodiments, the reference voltage Vref1 and the reference voltage Vref2 are substantially the same. Alternatively stated, the reference voltage Vref1 and the reference voltage Vref2 are varied in the same manner by the power supply 160. For example, as shown in FIGS. 4A-4B, the reference voltage Vref1 and the reference voltage Vref2 are both stepped up consecutively and have the same minimum and maximum voltage levels.

In some embodiments, the memory testing method 600 further includes: the power supply 160 stepping up one of the reference voltage Vref1 and the reference voltage Vref2; and the power supply 160 stepping down another one of the reference voltage Vref1 and the reference voltage Vref2. For example, as shown in FIGS. 4A and 4C, the reference voltage Vref1 is stepped up gradually during time T1 and time T12, and the reference voltage Vref2 is stepped down gradually during time T1 and time T12.

In some embodiments, the memory testing method 600 further includes: the processor 120 executing a first testing program and controlling the reference voltage Vref1 to vary from the voltage level VL1 to the voltage level VL11, or from the voltage level VL11 to the voltage level VL1, to generate first testing results of the memory device 144d corresponding to the first testing program; and executing a second testing program different from the first testing program and controlling the reference voltage Vref1 to vary from the voltage level VL1 to the voltage level VL11, or from the voltage level VL11 to the voltage level VL1, to generate second testing results of the first memory device 144d corresponding to the second testing program. For example, the processor 120 first tests the memory device 144d by executing the testing program P1 and generates the testing results corresponding to the testing program P1, and each of the testing results correspond to one of the voltage levels VL1-VL11. Then, the processor 120 tests the memory device 144d by executing the testing program P2 and generates the testing results corresponding to the testing program P2, and each of the testing results correspond to one of the voltage levels VL1-VL11.

In conclusion, the present disclosure provides a memory testing system and a memory testing method that are able to automatically adjust the reference voltage Vref received by the memory device 144 under test and test multiple memory devices 144 at the same time. Therefore, the efficiency for testing memory devices is improved, and less manpower is required during the testing process.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A memory testing system, comprising:
   at least one memory device;
   a power supply configured to provide a first reference voltage to the at least one memory device according to a control signal; and
   a processor configured to:
   provide the control signal to control the power supply to vary the first reference voltage among a plurality of voltage levels; and
   test the at least one memory device under the plurality of voltage levels to generate a plurality of first testing results corresponding to the plurality of voltage levels,
   wherein the processor is further configured to execute a first testing program and control the power supply to vary the first reference voltage from a first voltage level of the plurality of voltage levels to a second voltage level of the plurality of voltage levels to generate the plurality of first testing results corresponding to the first testing program, and
   execute a second testing program different from the first testing program and control the power supply to vary the first reference voltage from the first voltage level to the second voltage level to generate a plurality of second testing results corresponding to the second testing program,
   wherein the first voltage level is one of a lowest one of the plurality of voltage levels and a highest one of the plurality of voltage levels, and
   the second voltage level is another one of the lowest one of the plurality of voltage levels and the highest one of the plurality of voltage levels.

2. The memory testing system of claim 1, wherein the processor is further configured to control the power supply to step up or down the first reference voltage.

3. The memory testing system of claim 1, wherein a difference between two adjacent voltage levels of the plurality of voltage levels is equal to a difference between another two adjacent voltage levels of the plurality of voltage levels.

4. The memory testing system of claim 1, wherein the processor is further configured to:
   generate a first testing result of the plurality of first testing results, a second testing result of the plurality of first testing results, and a third testing result of the plurality of first testing results,
   wherein the first testing result, the second testing result and the third testing result correspond to the first voltage level, a third voltage level and the second voltage level, respectively, and
   the third voltage level is between the first voltage level and the second voltage level.

5. The memory testing system of claim 4, wherein the processor is further configured to:
   generate a fourth testing result of the plurality of second testing results, a fifth testing result of the plurality of second testing results, and a sixth testing result of the plurality of second testing results,
   wherein the fourth testing result, the fifth testing result and the sixth testing result correspond to the first voltage level, the third voltage level and the second voltage level, respectively.

6. The memory testing system of claim 1, wherein the first reference voltage has a first voltage level of the plurality of voltage levels during a first period, has a second voltage level of the plurality of voltage levels during a second period, and has a third voltage level of the plurality of voltage levels during a third period,
   the first period, the second period and the third period are arranged in order,
   the second voltage level is between the first voltage level and the third voltage level, and
   three of the plurality of first testing results correspond to the first voltage level, the second voltage level, and the third voltage level, respectively.

7. The memory testing system of claim 1, wherein
   the at least one memory device comprises a first memory device and a second memory device different from each other;
   the power supply is further configured to provide the first reference voltage to the first memory device and provide a second reference voltage to the second memory device; and
   the processor is further configured to control the power supply to vary the second reference voltage among the plurality of voltage levels.

8. The memory testing system of claim 7, wherein the processor is further configured to:
   execute a testing program to test the first memory device to generate a first testing result of the plurality of first testing results, the first testing result corresponding to the first reference voltage, and
   execute the testing program to test the second memory device to generate a second testing result of the plurality of first testing results, the second testing result corresponding to the second reference voltage.

9. The memory testing system of claim 7, wherein the first reference voltage has a first voltage level of the plurality of voltage levels during a first period, has a second voltage level of the plurality of voltage levels during a second period, and has a third voltage level of the plurality of voltage levels during a third period and the second reference voltage has the first voltage level during the third period, has the second voltage level during the second period, and has the third voltage level during the first period.

10. The memory testing system of claim 7, wherein the first reference voltage is substantially equal to the second reference voltage.

11. A memory testing method, comprising:
    providing a first reference voltage to a first memory device;
    adjusting the first reference voltage from a first voltage level to a second voltage level during a plurality of time periods; and
    testing the first memory device during the plurality of time periods in response to each of the first voltage level and the second voltage level,
    providing a second reference voltage to a second memory device different from the first memory device;
    adjusting the second reference voltage from one of the first voltage level and the second voltage level to another one of the first voltage level and the second voltage level during the plurality of time periods; and
    applying a testing signal to test the second memory device during the plurality of time periods in response to the second reference voltage,
    wherein testing the first memory device comprises applying the testing signal to the first memory device.

12. The memory testing method of claim 11, wherein the first reference voltage and the second reference voltage are substantially the same.

13. The memory testing method of claim 11, wherein adjusting the first reference voltage comprises adjusting the first reference voltage to the first voltage level at a first period of the plurality of time periods and adjusting the first reference voltage to the second voltage level at a second period of the plurality of time periods; and adjusting the second reference voltage comprises adjusting the second reference voltage to the first voltage level at the second period and adjusting the second reference voltage to the second voltage level at the first period.

14. The memory testing method of claim 11, further comprising:

stepping up one of the first reference voltage and the second reference voltage; and stepping down another one of the first reference voltage and the second reference voltage.

15. The memory testing method of claim 11, further comprising:

generating a plurality of first testing results in response to the testing signal during the plurality of time periods; and generating a plurality of second testing results in response to the testing signal during the plurality of time periods, wherein a number of the plurality of first testing results, a number of the plurality of second testing results and a number of the plurality of time periods are the same.

16. The memory testing method of claim 11, wherein adjusting the first reference voltage comprises:

adjusting the first reference voltage to a third voltage level to test the first memory device for the third voltage level, the third voltage level is between the first voltage level and the second voltage level.

17. The memory testing method of claim 16, wherein adjusting the first reference voltage further comprises:

adjusting the first reference voltage among a plurality of voltage levels including the first voltage level, the second voltage level and the third voltage level to test the first memory device for each of the plurality of voltage levels, wherein a difference between two adjacent voltage levels of the plurality of voltage levels is equal to a difference between another two adjacent voltage levels of the plurality of voltage levels.

18. The memory testing method of claim 11, further comprising:

executing a first testing program and controlling the first reference voltage to vary from the first voltage level to the second voltage level to generate a plurality of first testing results of the first memory device corresponding to the first testing program; and executing a second testing program different from the first testing program and controlling the first reference voltage to vary from the first voltage level to the second voltage level to generate a plurality of second testing results of the first memory device corresponding to the second testing program.

\* \* \* \* \*